(12) United States Patent
Wang et al.

(10) Patent No.: US 7,671,444 B2
(45) Date of Patent: Mar. 2, 2010

(54) EMPTY VIAS FOR ELECTROMIGRATION DURING ELECTRONIC-FUSE RE-PROGRAMMING

(75) Inventors: Ping-Chuan Wang, Hopewell Junction, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 11/767,580

(22) Filed: Jun. 25, 2007

(65) Prior Publication Data
US 2008/0315353 A1    Dec. 25, 2008

(51) Int. Cl.
*H01L 23/525* (2006.01)
*H01L 23/58* (2006.01)
*H01L 29/00* (2006.01)

(52) U.S. Cl. ............... 257/529; 257/209; 257/530; 257/E23.147; 257/E23.149; 257/E23.15; 438/468; 438/469; 438/601; 438/637; 361/626; 361/628; 361/642

(58) Field of Classification Search ........... 257/209, 257/529, 530; 438/468, 601; 365/225.7
See application file for complete search history.

(56) References Cited

U.S. PATENT DOCUMENTS

| 6,242,789 | B1 * | 6/2001 | Weber et al. | 257/529 |
| 6,355,969 | B1 * | 3/2002 | Skala et al. | 257/530 |
| 7,200,064 | B1 | 4/2007 | Boerstler et al. | |
| 7,557,424 | B2 * | 7/2009 | Wong et al. | 257/529 |
| 2008/0186788 | A1 * | 8/2008 | Barth | 365/225.7 |

OTHER PUBLICATIONS

T. Ueda; H. Takaoka; M. Hamada; Y. Kobayashi; A. Ono, "A Novel Cu Electrical Fuse Structure and Blowing Scheme Utilizing Crack-Assisted Mode for 90-45nm-Node and Beyond". VLSI Technology, 2006. Digest of Technical Papers. pp. 138-139.

* cited by examiner

*Primary Examiner*—Dao H Nguyen
(74) *Attorney, Agent, or Firm*—Yunamin Cai; Hoffman Warnick LLC

(57) ABSTRACT

The disclosure relates generally to integrated circuit (IC) chip fabrication, and more particularly, to an e-fuse device including an opening, a first via and a second via in an interlayer dielectric, wherein the opening, the first via and the second via are connected to an interconnect below the interlayer dielectric; a dielectric layer that encloses the first via and the second via; and a metal layer over the dielectric layer, wherein the metal layer fills the opening with a metal, and wherein the first via and the second via are substantially empty to allow for electromigration of the interconnect during re-programming of the e-fuse device.

6 Claims, 4 Drawing Sheets

US 7,671,444 B2

EMPTY VIAS FOR ELECTROMIGRATION DURING ELECTRONIC-FUSE RE-PROGRAMMING

BACKGROUND

1. Technical Field

The disclosure relates generally to integrated circuit (IC) chip fabrication, and more particularly, to an electrical-fuse (e-fuse) including empty vias for electromigration during e-fuse re-programming.

2. Background Art

Circuit programming at the product level after packaging is challenging. One approach that is currently practiced in advanced technologies is e-fuse programming employing a silicided polysilicon gate structure as the fuse link. During e-fuse programming, a high current pulse is passed through the silicided gate to cause damage on the silicide layer to increase resistance. Another e-fuse approach includes utilizing electromigration in metal interconnects to induce an electrical open. Electromigration induces atom drift in the direction of electron current flow, causing a void at the cathode end and metal extrusion at the anode end. However, the metal extrusion causes dielectric breakdown, intra-level shorting, and crack propagation during the thermal cycle, therefore causing major reliability concerns.

SUMMARY

The disclosure relates generally to integrated circuit (IC) chip fabrication, and more particularly, to an e-fuse device including empty vias for electromigration during e-fuse re-programming.

A first aspect of the disclosure is directed to a method of forming an electrical-fuse (e-fuse) device comprising: forming an opening, a first via and a second via in an interlayer dielectric, wherein the opening, the first via and the second via are connected to an interconnect below the interlayer dielectric; enclosing the opening, the first via and the second via by depositing a dielectric layer over the interlayer dielectric; etching the dielectric layer and the opening to enlarge the opening; and forming a metal over the dielectric layer, wherein the metal fills the opening, and wherein the first via and the second via are substantially empty to allow for electromigration of the interconnect during re-programming of the e-fuse device.

A second aspect of the invention is directed to an electrical-fuse (e-fuse) device comprising: an opening, a first via and a second via in an interlayer dielectric, wherein the opening, the first via and the second via are connected to an interconnect below the interlayer dielectric; a dielectric layer that encloses the first via and the second via; and a metal filling the opening, wherein the first via and the second via are substantially empty to allow for electromigration of the interconnect during re-programming of the e-fuse device.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
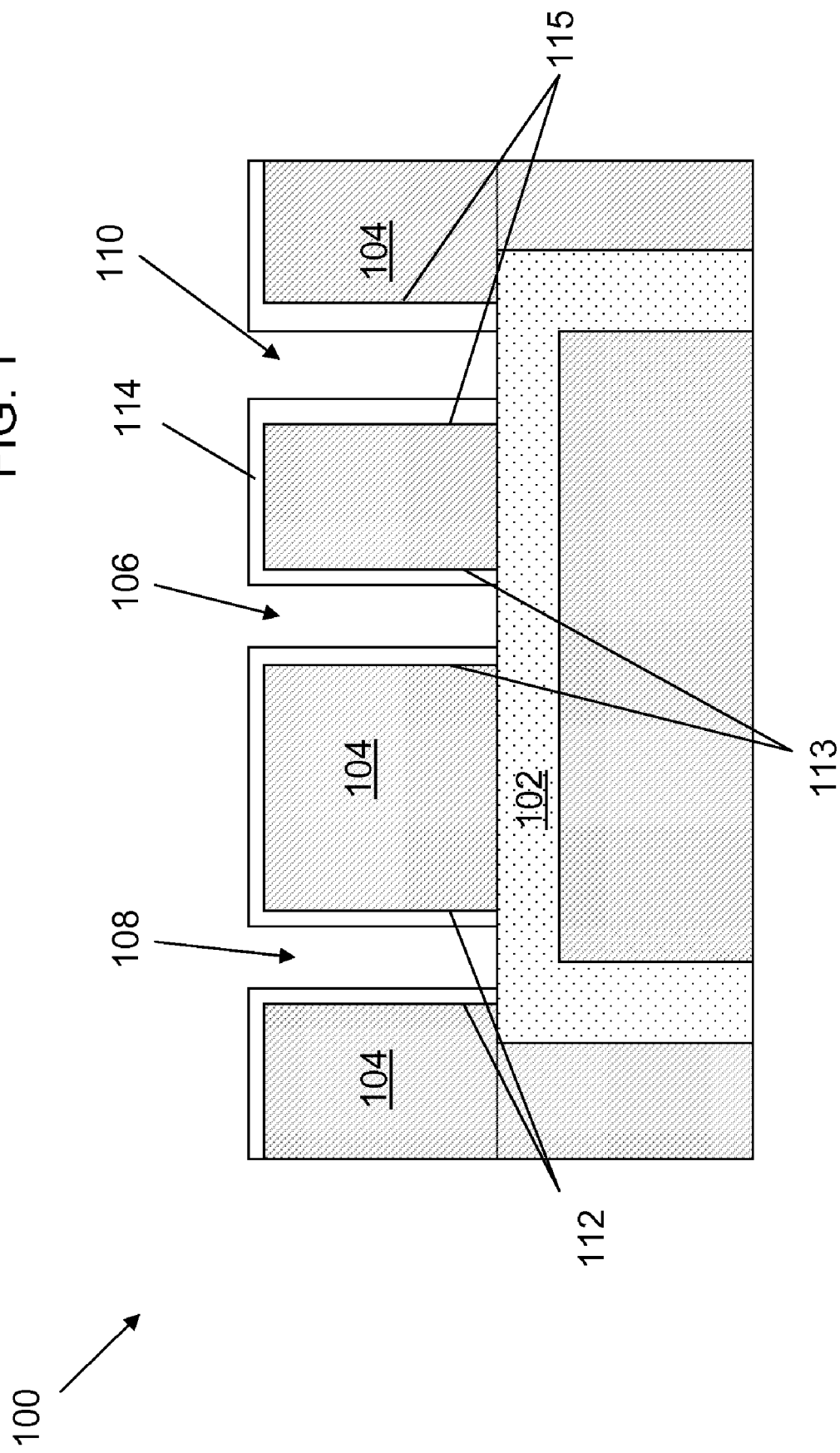
FIGS. 1-4 show embodiments of methods and a structure according to the disclosure.

Turning to the drawings, FIG. 1 shows a preliminary structure 100, to which methods according to embodiments of the disclosure will be applied. Although a single structure 100 is shown for the sake of clarity, it should be appreciated that multiple structures are possible. As shown, an interlayer dielectric 104 may be formed over an interconnect 102 to form an electrical fuse (e-fuse) device. Interconnect 102 includes any one of a number of materials selected from the group consisting of copper (Cu), aluminum (Al), copper-clad aluminum and silver (Ag). Interlayer dielectric 104 includes any of a number of materials, including a low or ultra low k (ULK) dielectric constant material comprising atoms of silicon, carbon, oxygen and hydrogen (SiCOH), silicon (Si), silicon dioxide ($SiO_2$) and silicon nitride ($Si_3N_4$). As also shown in FIG. 1, an opening 106, a first via 108 and a second via 110 are formed in interlayer dielectric 104, wherein opening 106, first via 108 and second via 108 are connected to interconnect 102 below interlayer dielectric 104. Portions of interlayer dielectric 104 left unexposed by a photoresist mask (not shown) are removed, for example, by reactive ion etching (RIE). Etching extends through interlayer dielectric 104 and stops at interconnect 102, thus forming opening 106, first via 108 and second via 110. The etching chemistry can be any now known or later developed recipe used for the above-described layers, e.g., a hydrogen-bromide (HBr) based chemistry.

Figure 2:
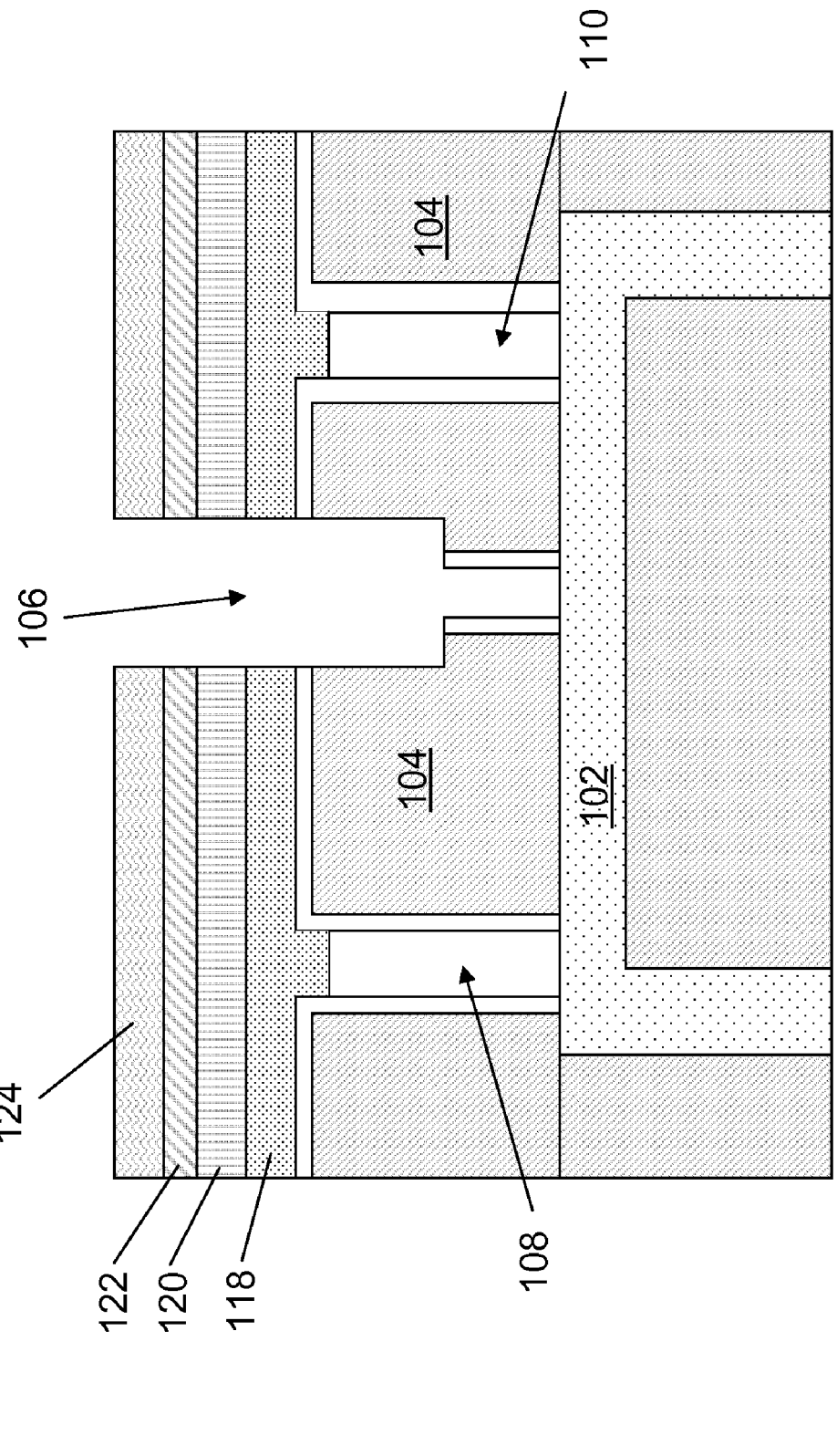

As also shown in FIG. 1, structure 100 includes a capping layer 114 formed over a sidewall surface 113 of opening 106, a sidewall surface 112 of first via 108 and a sidewall surface 115 of second via 110 prior to the step of depositing dielectric layer 118 (FIG. 2). As used herein, formation may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Capping layer 114 prevents diffusion in and out of interlayer dielectric 104. Capping layer 114 includes any one of a number of materials selected from the group consisting of nitrogen and hydrogen doped silicon carbide (SiC(N,H)), silicon dioxide ($SiO_2$), and silicon nitride ($Si_3N_4$).

In a next process, as shown in FIG. 2, opening 106, first via 108 and second via 110 are enclosed by depositing a dielectric layer 118 over interlayer dielectric 104. Dielectric layer 118 provides a barrier over opening 106, first via 108 and second via 110, while allowing openings 106, 108 to remain substantially empty. Dielectric layer 118 may include any number of materials selected from the group consisting of SiCOH, $SiO_2$ and $Si_3N_4$. Next, underlayer coating 120 and antireflective coating 122 are deposited over dielectric layer 118. Underlayer coating 120 may include a blowing agent, an organic material and a solvent, or a polymer having a blowing group and a solvent. Underlayer coating 120 makes it possible to attain a high dry etching rate. Anti-reflective coating 122 includes organic or inorganic antireflective coatings that work by matching the refractive index of the coating with that of the photoresist. If there is no change in the refractive index at the anti-reflective coating and resist interface, there will be no reflection. Antireflective coating 122 may also be designed to absorb light, so that light that penetrates antireflective coating 122 is absorbed before it reaches the next interface.

In a next process, as also shown in FIG. 2, dielectric layer 118 and opening 106 (FIG. 1) are etched (not shown) to enlarge opening 106 in interlayer dielectric 104. Portions of interlayer dielectric 104, dielectric layer 118, underlayer coating 120 and antireflective coating 122 left unexposed by photoresist mask 124 are removed, for example, by reactive ion etching. The etching chemistry can be any now known or later developed recipe used for the above-described layers, e.g., a hydrogen-bromide (HBr) based chemistry.

Figure 3:
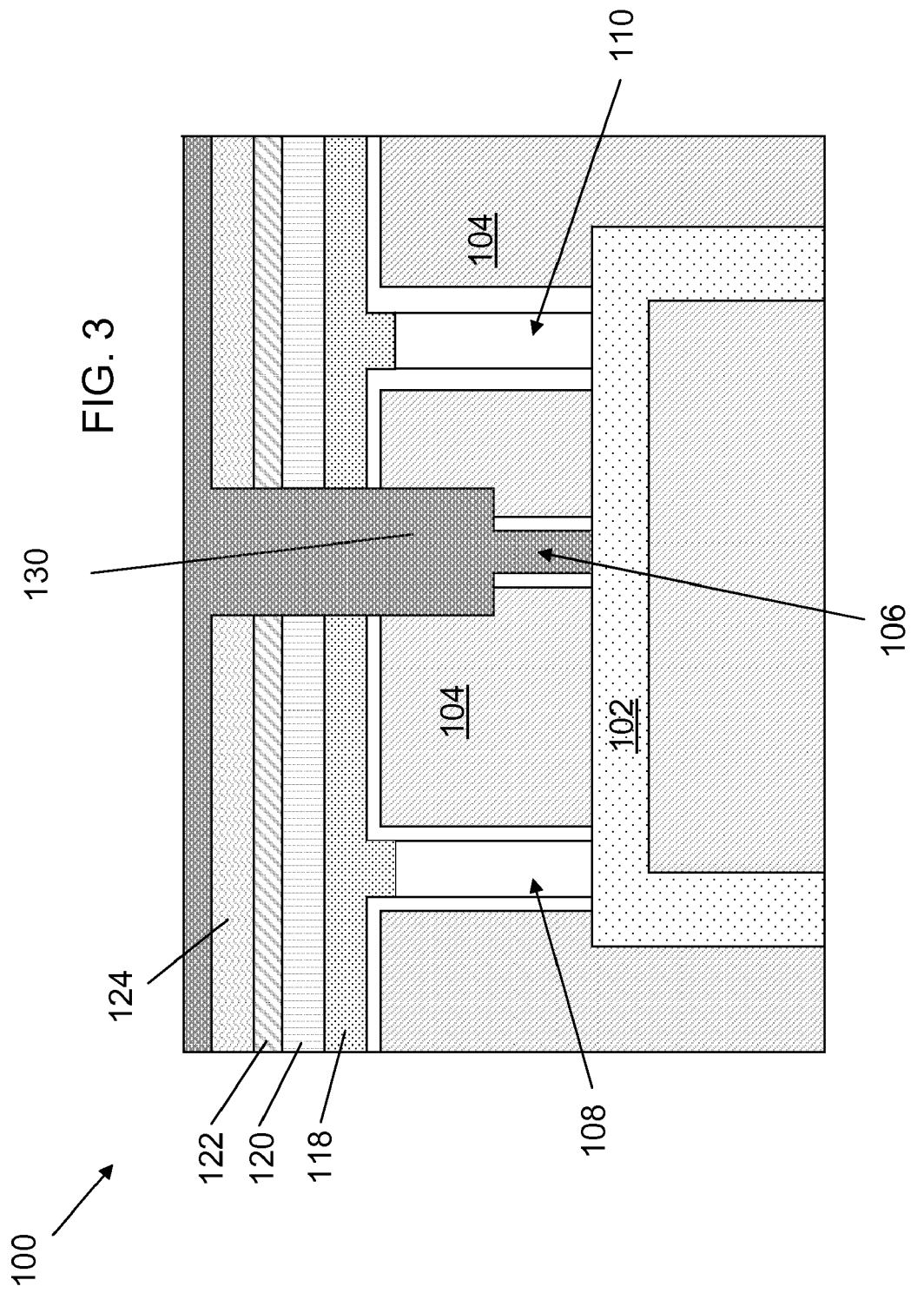
Figure 4:
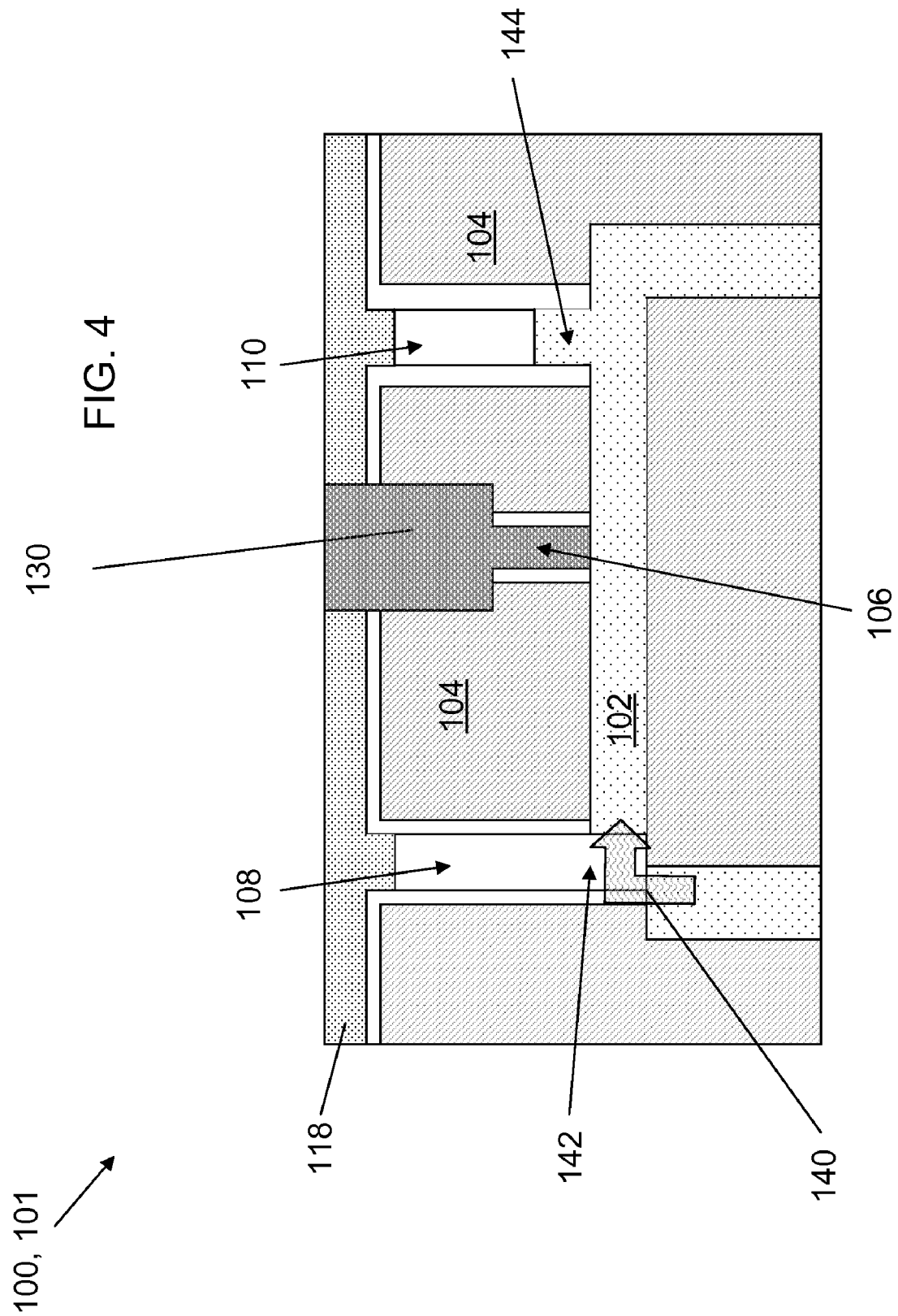

In a next process, as shown in FIG. 3, a metal 130 is formed over interlayer dielectric 104, wherein metal 130 fills opening 106, and wherein first via 108 and second via 110 are substantially empty to allow for electromigration of interconnect 102 during re-programming of e-fuse device 101 (FIG. 4). Metal 130 includes any of a number of materials, including copper (Cu), aluminum (Al), copper-clad aluminum and/or silver (Ag). First via 108 and second via 110 are substantially empty to accommodate metal pileup from interconnect 102 during electromigration. For conventional e-fuse structures employing silicided polysilicon gates, current pulses passing through a silicided gate (not shown) cause massive damage to the semiconductor structure to induce a significant increase in resistance.

As shown in FIG. 4, the structure and methods according to the disclosure take advantage of the electromigration phenomenon in metal interconnects and provide localized open spaces (vias 108, 110) adjacent to interconnect wires (interconnect 102) so that metal extrusion/dielectric cracking can be avoided during e-fuse programming processes. During programming and re-programming of e-fuse devices, electromigration induces atom drift in the direction of electron current flow (shown as arrow 140), causing a void 142 in first via 108 at the cathode end and metal extrusion 144 in second via 110 at the anode end. Although not shown, the direction of current flow can be reversed during re-programming of e-fuse device 101. Consequently, the redirection of current flow causes a void in second via 110 and metal extrusion in first via 108.

The e-fuse device 101 and methods described above are used in the fabrication and/or operation of integrated circuit (IC) chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of forming an electrical-fuse (e-fuse) device comprising:
    forming an opening, a first via and a second via in an interlayer dielectric, wherein the opening, the first via and the second via are connected to an interconnect below the interlayer dielectric;
    enclosing the opening, the first via and the second via by depositing a dielectric layer over the interlayer dielectric;
    etching the dielectric layer and the opening to enlarge the opening; and
    forming a metal over the dielectric layer, wherein the metal fills the opening, and wherein the first via and the second via are substantially empty to allow for electromigration of the interconnect during re-programming of the e-fuse device.

2. The method of claim 1, further comprising forming a capping layer over a sidewall surface of the opening, a sidewall surface of the first via and a sidewall surface of the second via prior to the step of depositing the dielectric layer.

3. The method of claim 1, wherein the interconnect is selected from the group consisting of copper, aluminum, copper-clad aluminum and silver.

4. An electrical-fuse (e-fuse) device comprising:
    an opening, a first via and a second via in an interlayer dielectric, wherein the opening, the first via and the second via are connected to an interconnect below the interlayer dielectric;
    a dielectric layer that encloses the first via and the second via; and
    a metal over the dielectric layer, wherein the metal fills the opening, and wherein the first via and the second via are substantially empty to allow for electromigration of the interconnect during re-programming of the e-fuse device.

5. The method of claim 4, further comprising a capping layer over a sidewall surface of the opening, a sidewall surface of the first via and a sidewall surface of the second via.

6. The method of claim 4, wherein the interconnect is selected from the group consisting of copper, aluminum, copper-clad aluminum and silver.

* * * * *